(12) United States Patent
Sopko et al.

(10) Patent No.: US 6,590,771 B2
(45) Date of Patent: Jul. 8, 2003

(54) HEAT SINK ASSEMBLY AND METHOD

(75) Inventors: Jeffrey J. Sopko, Beaverton, OR (US); George R. Anderson, Milwaukie, OR (US); George Hsieh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/006,195

(22) Filed: Dec. 3, 2001

(65) Prior Publication Data

US 2003/0103332 A1 Jun. 5, 2003

(51) Int. Cl.[7] .................................................. H05K 7/20
(52) U.S. Cl. ...................... 361/704; 29/890.03; 24/296; 257/719
(58) Field of Search ...................... 29/890.03; 174/16.3; 165/80.3, 185; 257/718, 719, 726, 727; 361/704, 705, 709–712, 717–719; 267/150, 158, 160; 24/296, 453, 457, 458; 248/316.7, 505, 510; 439/485, 487

(56) References Cited

U.S. PATENT DOCUMENTS

| 5,386,338 | A | * | 1/1995 | Jordan et al. | 361/704 |
| 5,448,449 | A | * | 9/1995 | Bright et al. | 361/704 |
| 6,061,239 | A | * | 5/2000 | Blomquist | 361/704 |
| 6,424,530 | B1 | * | 7/2002 | Lee et al. | 361/704 |
| 6,449,157 | B1 | * | 9/2002 | Chu | 361/704 |

* cited by examiner

*Primary Examiner*—Gerald Tolin
(74) *Attorney, Agent, or Firm*—Schwegman, Lundberg, Woessner & Kluth, P.A.

(57) ABSTRACT

A heat sink assembly includes an electronic device, a heat sink and a clip that compresses the heat sink against the electronic device. A spacer is mounted on the clip to restrain motion of the heat sink relative to the electronic device. A method of securing a heat sink to an electronic device includes compressing the heat sink against the electronic device with a clip, and attaching a spacer to the clip in order to restrain motion.

26 Claims, 9 Drawing Sheets

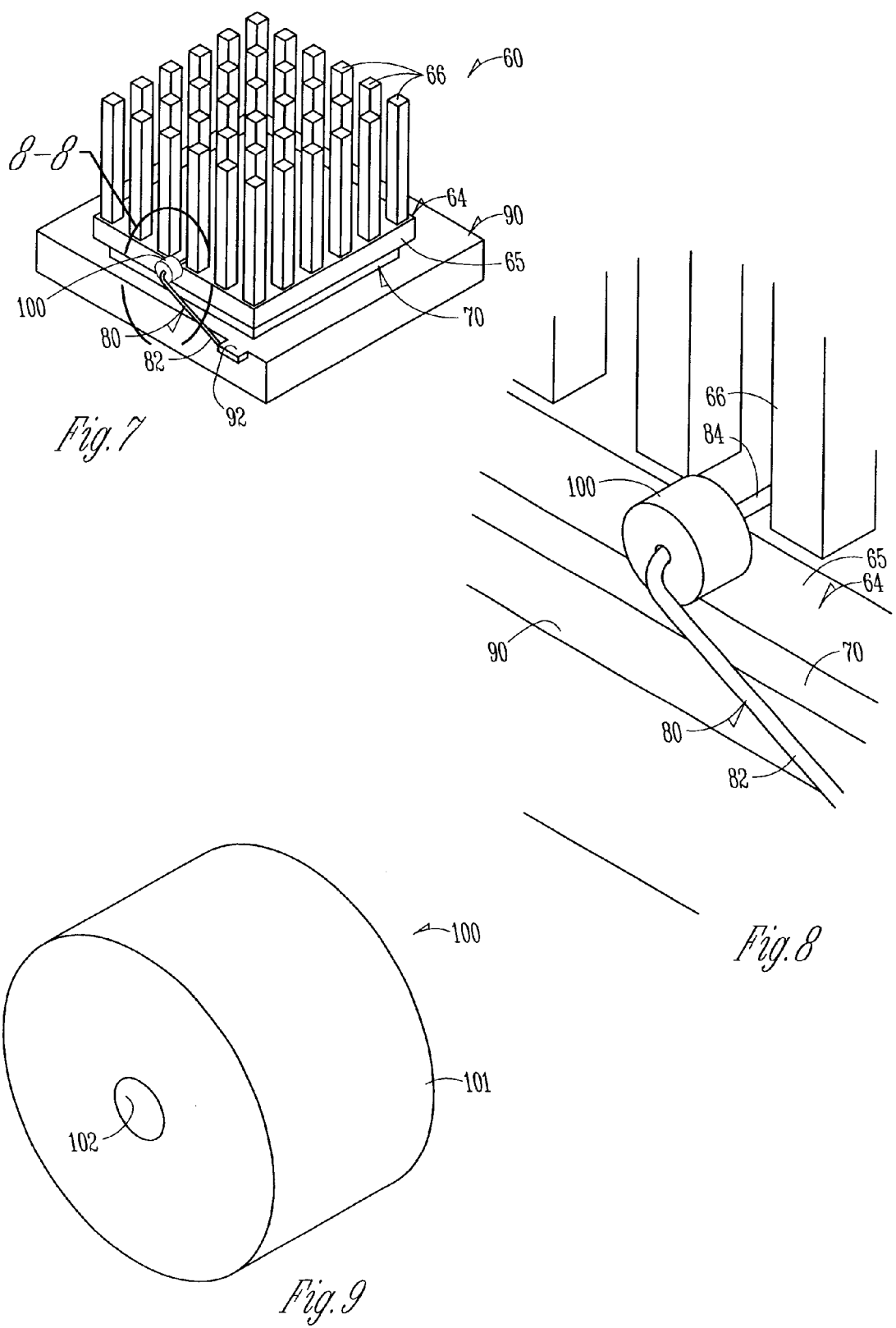

HEAT SINK ASSEMBLY AND METHOD

TECHNICAL FIELD OF THE INVENTION

The present invention relates to a heat sink assembly and a method of assembling a heat sink to an electronic device. The invention particularly relates to a heat sink assembly that includes a clip which compresses a heat sink against an electronic device.

BACKGROUND

Electronic devices generate heat during operation. Thermal management refers to the ability to keep temperature-sensitive elements in an electronic device within a prescribed operating temperature.

Historically, electronic devices have been cooled by natural convection. The cases or packaging of the devices included strategically located openings (e.g., slots) that allow warm air to escape and cooler air to be drawn in.

The advent of high performance electronic devices, such as processors, now require more innovative thermal management. Each increase in processing speed and power generally carries a "cost" of increased heat generation such that natural convection is no longer sufficient to provide proper thermal management.

One common method of cooling electronic devices includes thermally coupling a heat sink to the package of the electronic device. A typical heat sink includes protrusions, such as fins or pins, which project from a body of the heat sink. The protrusions give the heat sink a larger surface area such that the heat sink dissipates a greater amount of thermal energy from the package into the surrounding environment. Heat sinks are fabricated from materials with high thermal conductivity in order to efficiently transfer thermal energy from the electronic device package.

The heat sinks are typically mounted to the electronic devices by using adhesives, screws, and/or bolts. Another common method uses one or more clips to secure a heat sink to an electronic device.

FIGS. 1–5 illustrate a prior art heat sink assembly 10. Heat sink assembly 10 includes a heat sink 20, clip 30 and electronic device 40. Electronic device 40 is mounted to a frame, such as socket 50. Socket 50 is attached to a substrate, such as printed circuit board 51 (see FIGS. 4 and 5). Clip 30 compresses heat sink 20 against electronic device 40 and is typically in the form of a bent wire that includes two legs 32 and an elongated central portion 34 extending between the legs 32. Each leg 32 is substantially perpendicular to central portion 34 and extends from central portion 34 in an opposite direction to the other leg 32.

The central portion 34 of clip 30 extends between protrusions 28 on heat sink 20. Clip 30 is assembled to socket 50 by maneuvering legs 32 under a pair of tabs 52 that are positioned on opposing sides of socket 50. Legs 32 deflect elastically as they are moved under the tabs 52 generating a torque around the central portion 34 of clip 30. The torque compresses the central portion 34 of clip 30 against heat sink 20, which in turn compresses heat sink 20 against electronic device 40. Compressing heat sink 20 against electronic device 40 reduces the thermal resistance between heat sink 20 and electronic device 40.

FIG. 4 illustrates the proper position for heat sink 20 relative to electronic device 40. Heat sink 20 includes a contact surface 21 that should be engaged with electronic device 40 over the entire contact surface 21.

Mechanical shock or vibration during transportation and handling can cause heat sink 20 to shift relative to electronic device 40. FIG. 5 illustrates a case where heat sink 20 has shifted relative to electronic device 40. A portion 22 of the contact surface 21 on heat sink 20 is no longer fully engaged with electronic device 40. This situation is undesirable because anything less than full contact between the contact surface 21 on heat sink 20 and electronic device 40 renders heat sink 20 less effective in conducting thermal energy from electronic device 20.

There is a need for a heat sink assembly and method that securely attaches a heat sink to an electronic device, especially when subjected to mechanical shock or vibration. The clips that are presently used to fasten heat sinks to electronic device packages are unable to adequately secure a heat sink to an electronic device package under such circumstances.

BRIEF DESCRIPTION OF THE DRAWINGS

FIG. 7 is a perspective view of the heat sink assembly shown in FIG. 6.

FIG. 8 is an enlarged perspective view of the heat sink assembly shown in FIG. 6

FIG. 9 is a perspective view of the spacer in the heat sink assembly shown in FIG. 6.

DETAILED DESCRIPTION

Figure 1:
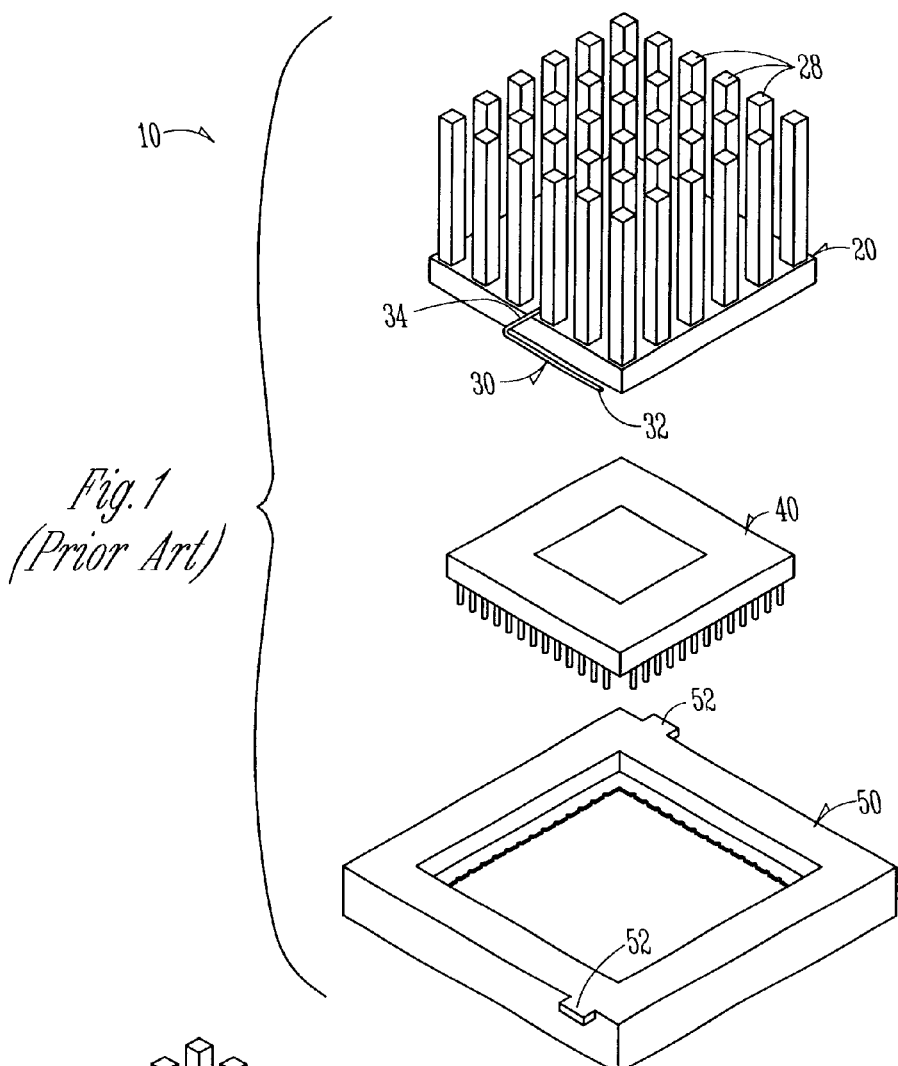
FIG. 1 is an exploded perspective view of a prior art heat sink assembly.
Figure 2:
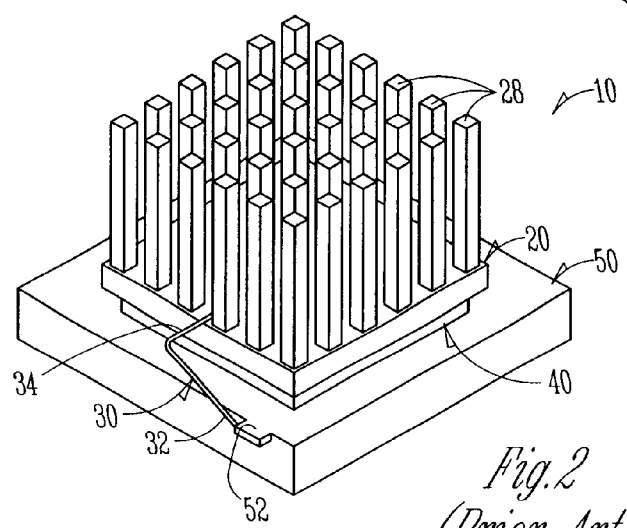
FIG. 2 is a perspective view of the heat sink assembly shown in FIG. 1.
Figure 3:
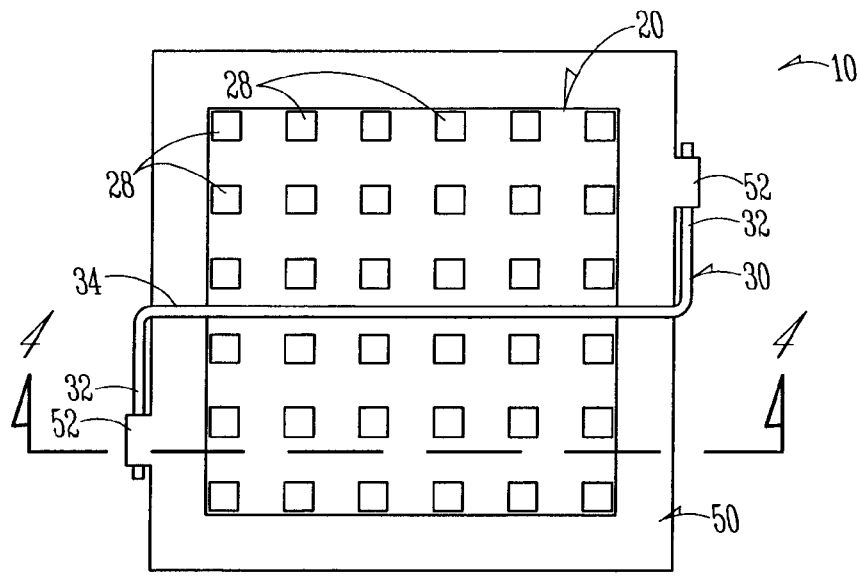
FIG. 3 is a top view of the heat sink assembly shown in FIG. 1.
Figure 4:
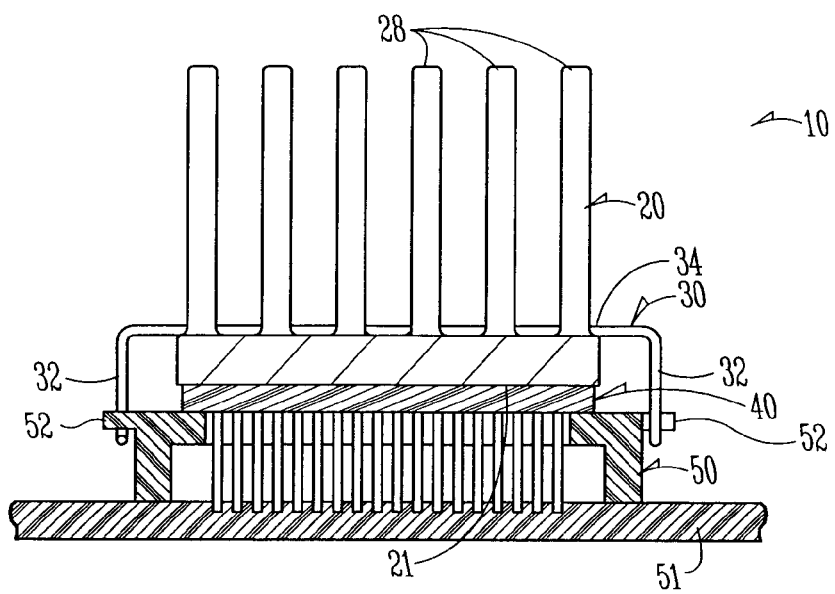
FIG. 4 is a cross-section view of the heat sink assembly shown in FIG. 3 taken along line 4—4.
Figure 5:
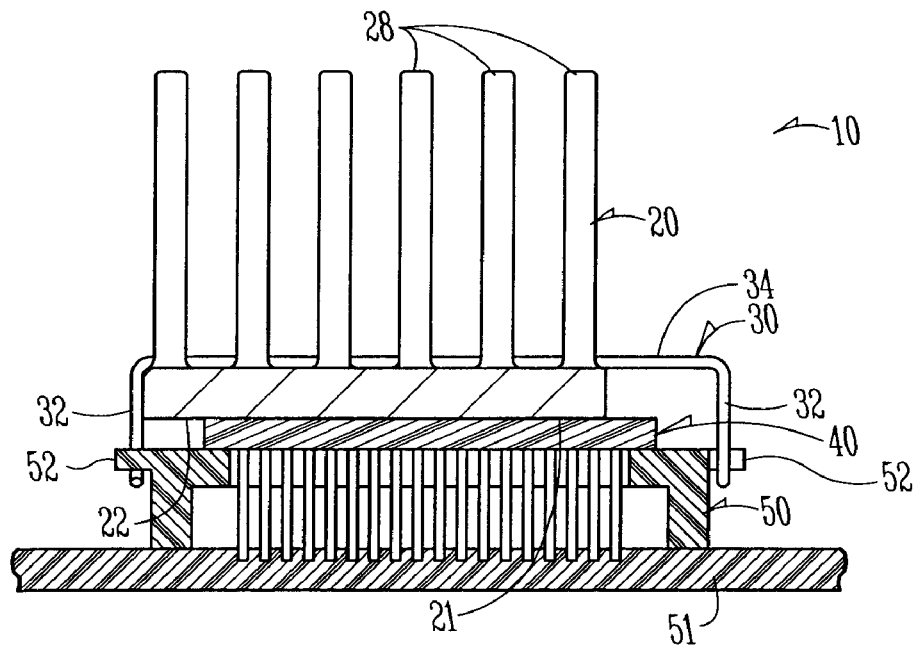
FIG. 5 is a cross-section view similar to FIG. 4 with a misaligned heat sink within the heat sink assembly.

The following detailed description of the invention references the accompanying drawings that show specific embodiments in which the invention may be practiced. Like numerals describe substantially similar components throughout each of the several views that make up the drawing. Other embodiments may be used, and structural, logical, and electrical changes made, without departing from the scope of the present invention.

The present invention relates to a heat sink assembly and a method of securing a heat sink to an electronic device. The assembly and method restrain the heat sink from moving relative to the electronic device as the heat sink conducts thermal energy from the electronic device. The heat sink assembly and method help to maintain the proper heat sink position relative to the electronic device even when the heat sink assembly is subjected to shock and/or vibration. Maintaining the proper position of the heat sink relative to the electronic device promotes thermal conductivity between the heat sink and the electronic device.

Figure 6:
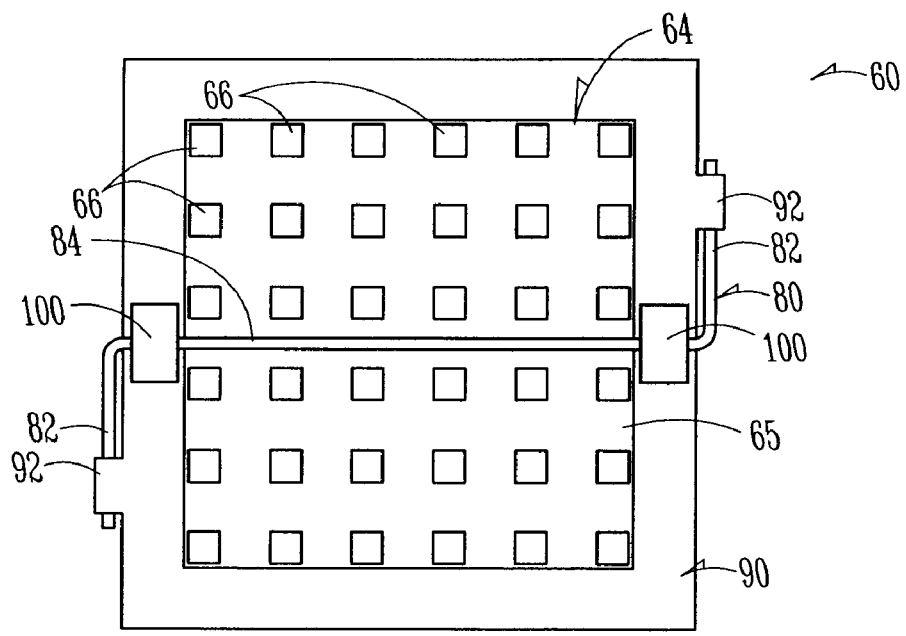
FIG. 6 is a top view illustrating a heat sink assembly of the present invention.

FIGS. 6–8 illustrate a heat sink assembly 60 of the present invention. The heat sink assembly 60 includes a heat sink 64, electronic device 70, clip 80 and socket 90. Heat sink assembly 60 further includes spacers 100 that are mounted to clip 80 to keep heat sink 64 from moving relative to electronic device 70 when the heat sink assembly 60 is subjected to shock and/or vibration.

Clip 80 compresses heat sink 64 against electronic device 70 to reduce the thermal resistance between heat sink 64 and electronic device 70. Clip 80 is in the form of a bent wire that includes two legs 82 and an elongated central portion 84 extending between the legs 82. Legs 82 are substantially perpendicular to central portion 84 and extend from central portion 84 in opposing directions.

During fabrication of heat sink assembly 60, clip 80 is elastically deflected to place each leg 82 under one of the tabs 92 that are on opposing sides of mounting socket 90. When each leg 82 is positioned under an opposing tab 92, clip 80 compresses heat sink 64 against electronic device 70. Spacers 100 are mounted on clip 80 such that each spacer 100 is between heat sink 64 and one of the legs 82 on clip 80.

The size of spacers 100 in comparison to the combined distance between each leg 82 on clip 80 and heat sink 64 determines the amount of movement that is axial to central portion 84 which could occur between heat sink 64 and electronic device 70. If the size of the spacers 100 matches the combined distance between the legs 82 and heat sink 64, then there would be no relative movement between heat sink 64 and electronic device 70. It should be noted that the heat sink assembly 60 may include only one spacer, multiple spacers or any combination of spacers without departing from the scope of the present invention.

Heat sink 64 includes a base 65 and protrusions 66 that project from the base 65. In an example embodiment, protrusions 66 are parallel elongated pins. A thermally conductive material, such as grease, soft metallic foil, or metal impregnated paste, may be placed between electronic device 70 and heat sink 64 to further minimize thermal resistance. Heat sink 64 can have any configuration because the design of heat sink 64 is determined by the thermal dissipation needs of electrical device 70 and the surrounding environment.

Heat sink 64 is preferably made from a material having good thermal conductivity such that heat sink 64 efficiently conducts thermal energy from electronic device 70. The thermal energy is conducted from electronic device 70 through the base 65 of heat sink 64 to protrusions 66. The large surface area of the numerous protrusions 66 facilitates transferring the thermal energy from heat sink 64 to the surrounding environment Clip 80 extends across the base 65 of heat sink 64 between protrusions 66. Clip 80 may be a strap, band or flat wire, and made from any material that is suitable for a particular application. In applications where clip 80 needs to generate a compressive force on heat sink 64, clip 80 is preferably made from a resilient material that can be elastically deflected.

Electronic device 70 is connected to socket 90. The socket 90 may provide an electrical connection between electronic device 70 and other electronic components through a substrate or other means. Although socket 90 includes tabs 92 that engage the legs 82 on clip 80, socket 90 may include other attachment structures depending on the type of clip that is used to compress heat sink 64 against electronic device 70.

FIG. 9 is an enlarged perspective view of spacer 100. Spacer 100 includes a substantially cylindrical body 101 and a bore 102 that extends through body 101. As shown in FIGS. 6–8, when the spacers 100 are used in the heat sink assembly 60, the legs 82 on clip 80 are formed after the clip 80 is inserted into the bore 102 in spacer 100. Spacer 100 may be made from plastic, metal, ceramic or any other material, including thermally and/or electrically insulating materials.

Figure 10:
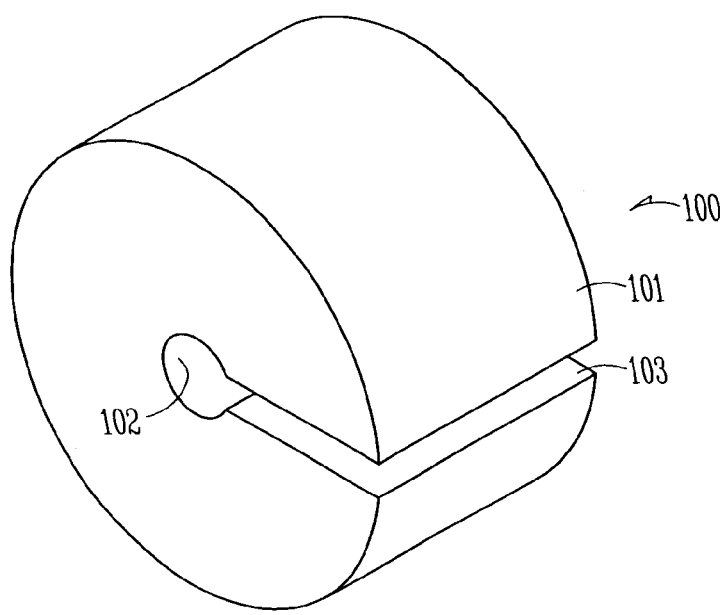
FIG. 10 is a perspective view of another type of spacer that could be used in the heat sink assembly shown in FIG. 6.

FIG. 10 illustrates that spacer 100 may also include a slot 103 that extends along the length of spacer 100. The slot 103 in spacer 100 allows spacer 100 to be mounted onto the central portion 84 of clip 80 after the legs 82 have been formed on clip 80. A spacer 100 with a slot 103 may also be mounted onto clip 80 after clip 80 has been fastened to the other components that make up heat sink assembly 60.

Figure 11:
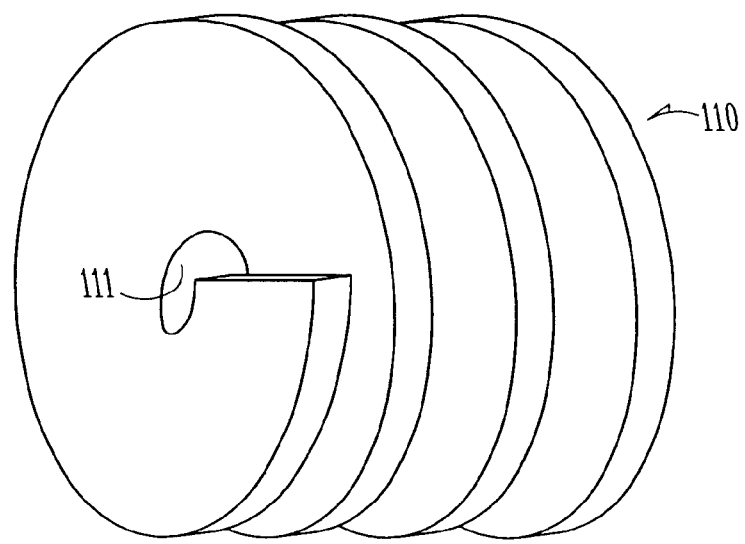
FIG. 11 is a perspective view of yet another type of spacer that could be used in the heat sink assembly shown in FIG. 6.

FIG. 11 illustrates a helical coil 110 that could be used as a spacer. The helical coil 110 includes an internal bore 111 that is adapted to receive the clip 80. In another example embodiment, helical coil 110 is a coil spring that is wrapped around the central portion 84 of clip 80.

Figure 12:
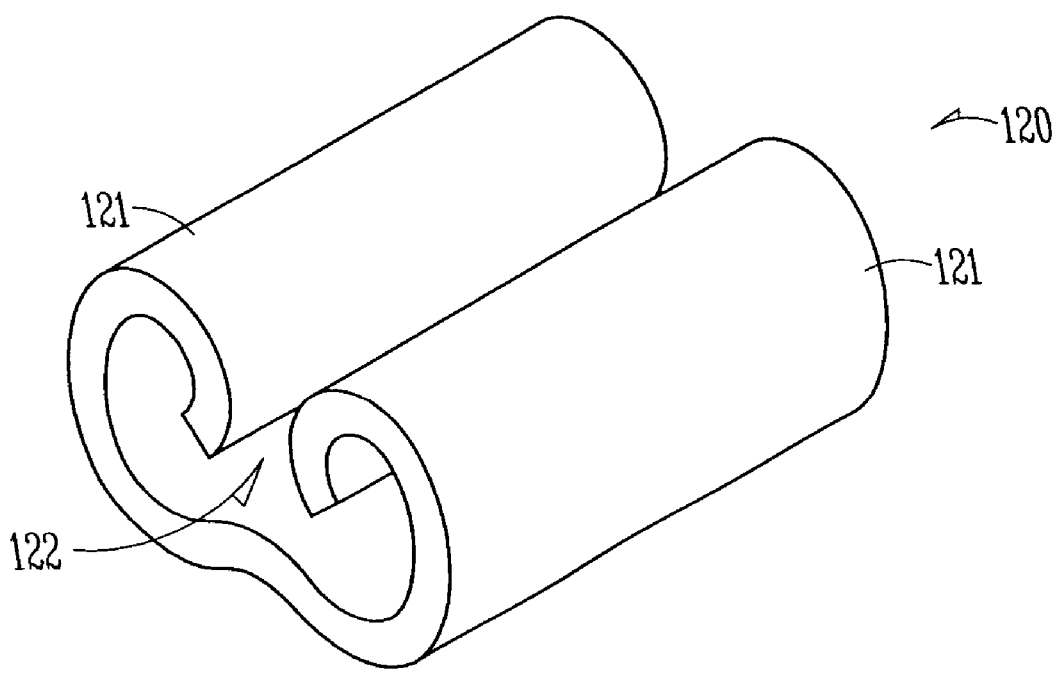
FIG. 12 is a perspective view of still another type of spacer that could be used in the heat sink assembly shown in FIG. 6.

FIG. 12 illustrates a locking member 120 that could be used as a spacer. Locking member 120 is fabricated from a sheet of resilient material. Locking member 120 includes oppositely rolled ends 121 that form an elongated slot 122 which is adapted to receive clip 80. As clip 80 is inserted into elongated slot 122, resilient rolled ends 121 initially deflect away from one another and then move back toward their original position to trap clip 80 within elongated slot 122.

Figure 13:
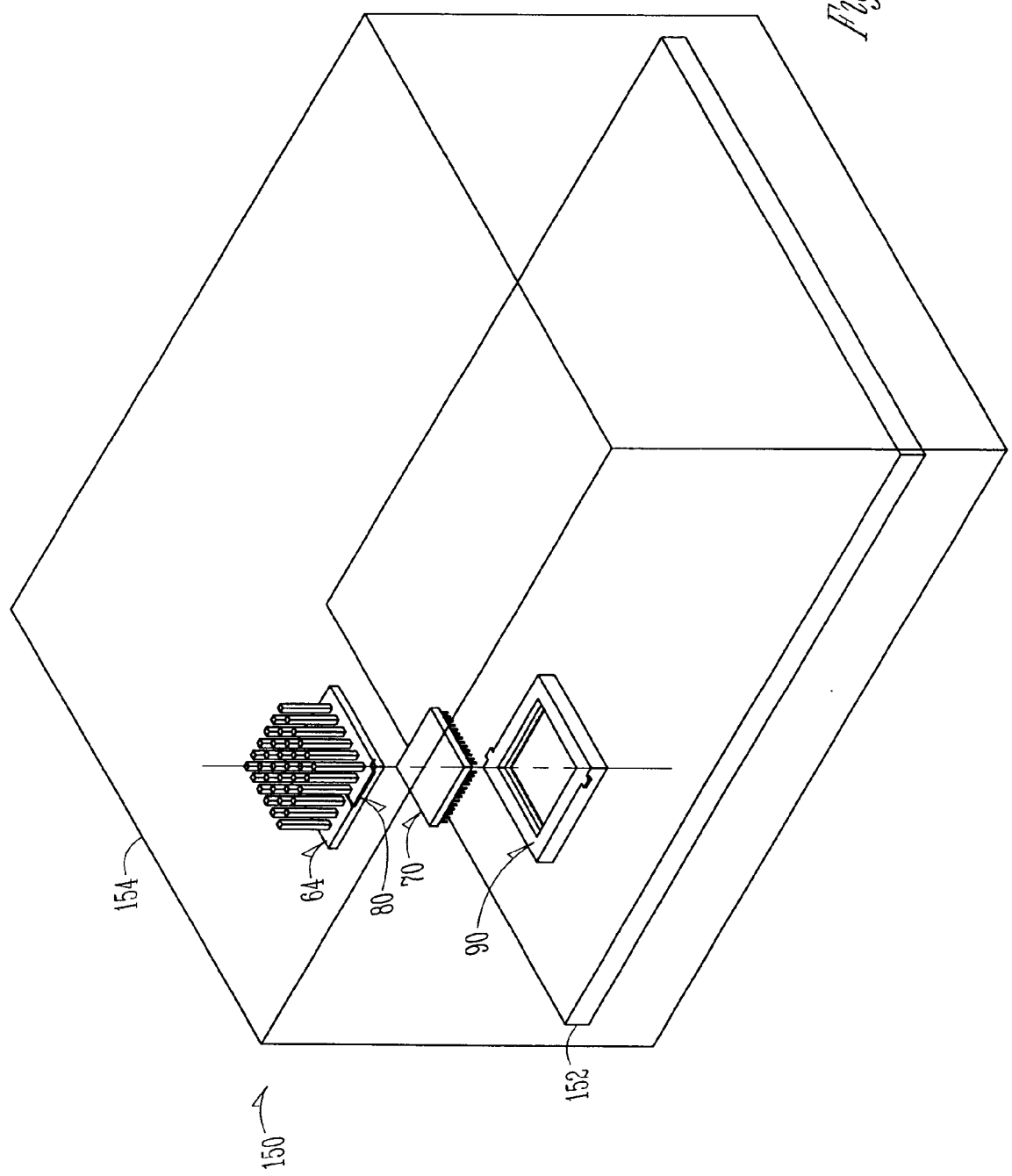
FIG. 13 is a perspective view illustrating a portion of a computer system that includes a heat sink assembly of the present invention.

FIG. 13 illustrates the heat sink assembly 60 of the present invention incorporated into a computer system 150. Computer system 150 includes a substrate, such as printed circuit board 152, that is coupled to a chassis 154. Socket 90 is mounted onto printed circuit board 152, and electronic device 70 is placed within socket 90. Clip 80 compresses heat sink 64 against electronic device 70 to reduce the thermal resistance between heat sink 64 and electronic device 70. Spacers 100 are mounted onto clip 80 to help keep heat sink 64 from moving relative to electronic device 70. It should be noted that heat sink assembly 60 may be incorporated into any type of computer system.

Another aspect of the present invention relates to a method of securing a heat sink 64 to an electronic device 70. The method includes positioning heat sink 64 in thermal contact with electronic device 70 and then compressing heat sink 64 against electronic device 70 with a clip 80 to reduce thermal resistance between heat sink 64 and electronic device 70. The method further includes attaching a spacer 100 to clip 80 in order to restrain motion of the heat sink 64 relative to electronic device 70.

When clip 80 includes two legs 82 and a central portion 84 disposed between the legs 82, compressing heat sink 64 against electronic device 70 includes engaging the legs 82 on clip 80 with tabs 92 that are on a socket 90 which supports electronic device 70. In addition, attaching a spacer 100 to clip 80 may include abutting one or more spacers 100 between the legs 82 on clip 80 and heat sink 64.

Another embodiment of the present invention relates to a kit of parts for forming a heat sink assembly 60 that is used to conduct thermal energy from an electronic device 70. The kit may comprise any combination of one or more (i) heat sinks 64 that are adapted to be thermally coupled to electronic device 70 such that heat sink 64 conducts thermal energy away from electronic device 70; (ii) clips 80 that are adapted to compress heat sink 64 against electronic device 70 to reduce the thermal resistance between heat sink 64 and electronic device; and (iii) spacers that are adapted to be coupled to clip 80 to keep heat sink 64 from moving relative to electronic device 70.

One of the advantages of assembling a heat sink assembly 60 using a kit of parts as described herein is that heat sink assembly 60 can be used with a variety of electronic devices that are mounted on industry standard integrated circuit boards. The heat sink assembly 60 is fabricated by selecting the appropriate components based on the space available and the particular thermal situation. The kit also allows the heat assembly 60 to be added to a computer system after a chassis in the computer has been assembled.

Figure 14:
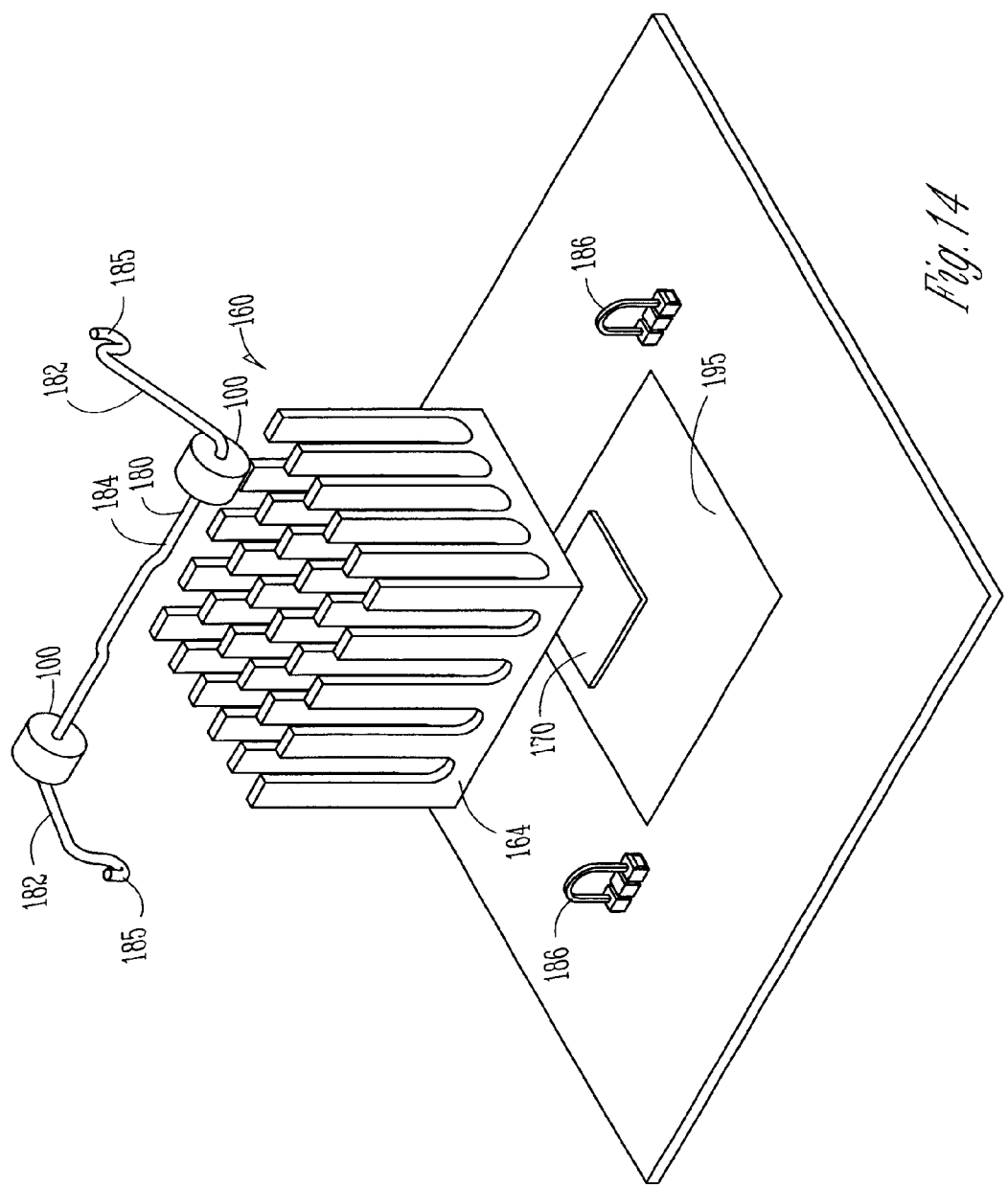
FIG. 14 is an exploded perspective view illustrating another heat sink assembly embodying the present invention.
Figure 15:
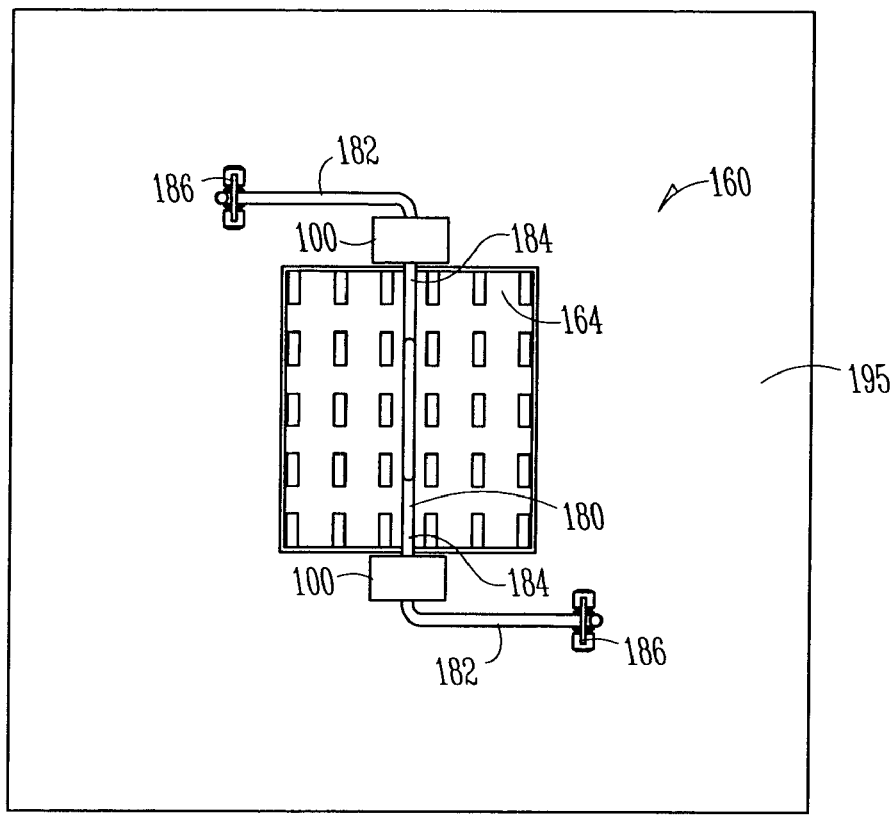
FIG. 15 is a top view of the heat sink assembly shown in FIG. 14.
Figure 16:
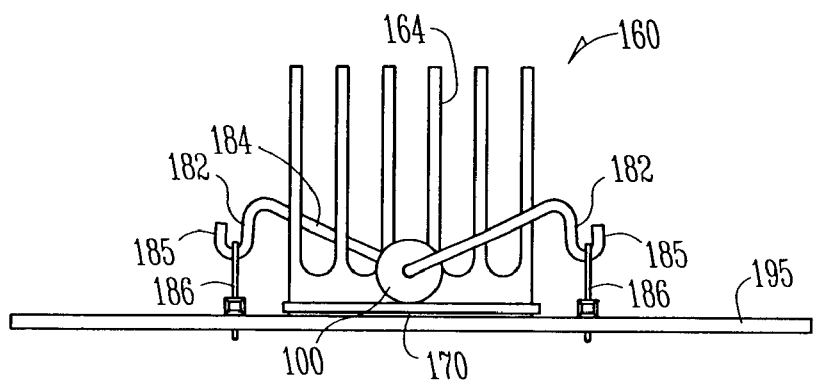
FIG. 16 is a side view of the heat sink assembly shown in FIG. 15.

FIGS. 14–16 illustrate another heat sink assembly 160 embodying the present invention. The heat sink assembly 160 includes a heat sink 164, electronic device 170, clip 180 and spacers 100. Clip 180 compresses heat sink 164 against electronic device 170, and includes two legs 182 and an angled central portion 184 extending between the legs 182. The ends of legs 182 includes hooks 185 that are used to secure clip 180 to anchors 186 that are mounted onto a substrate, such as circuit board 195.

During fabrication of heat sink assembly 160, electronic device 170 is mounted directly to printed circuit board 195. Clip 180 is elastically deflected to place each of the hooks 185 on legs 182 under one of the anchors 186 that are mounted on opposing sides of heat sink assembly 160. Spacers 100 are mounted on clip 180 such that each spacer 100 is between heat sink 164 and one of the legs 182 on clip 180.

In other example embodiments, one or more spacers may engage the clip within the heat sink. The clip could engage the fins on the heat sink to prevent movement of the heat sink that is perpendicular to the wire clip axis. In addition, any of the spacers depicted in the accompanying FIGS. may include an extension that fits between two of the fins to prevent movement of the heat sink relative to the electronic device. In another form, the spacer could be elongated so that it engages opposing outside surfaces of two inner fins to prevent movement of the heat sink.

The heat sink assembly, kit and method described above provide a universally applied thermal solution for high heat generating electronic devices. The universal applicability supplies thermal engineers with a multitude of options for cooling an electronic device, such as a high-powered processor.

Many other embodiments will be apparent to those of skill in the art from the above description. The scope of the invention should be determined with reference to the appended claims along with the full scope of equivalents to which such claims are entitled.

What is claimed is:

1. A heat sink assembly to extract thermal energy from an electronic device, the heat sink assembly comprising:

a heat sink;

a clip compressing the heat sink against the electronic device, the clip including two legs and a central section disposed between the legs; and a spacer mounted on the central portion of the clip, the spacer abutting the heat sink and one of the legs to restrain motion of the heat sink relative to the electronic device.

2. The heat sink assembly of claim 1, further comprising a socket that includes a pair of tabs that are positioned on opposing sides of the socket, wherein the electronic device is mounted to the socket and each leg on the clip is positioned under one of the tabs to generate a compressive force between the heat sink and the electronic device.

3. The heat sink assembly of claim 1, wherein the clip engages a base of the heat sink.

4. The heat sink assembly of claim 1, wherein the spacer includes a tubular member having a bore and the clip extends through the bore.

5. The heat sink assembly of claim 4, wherein the tubular member includes a slot extending along a length of the tubular member.

6. The heat sink assembly of claim 1, wherein the spacer is a helical coil that is wrapped around the clip.

7. The heat sink assembly of claim 1, wherein the spacer is a locking member.

8. The heat sink assembly of claim 7, wherein the locking member includes a sheet with two oppositely rolled ends that are adjacent to one another to form a cavity that receives the clip.

9. The heat sink assembly of claim 1, further comprising at least one additional spacer.

10. The heat sink assembly of claim 9, wherein at least one of the additional spacers is on an opposite side of the heat sink as the other spacers.

11. The heat sink assembly of claim 10, wherein the at least one of the additional spacers that is on the opposite side of the heat sink as the other spacers abuts the heat sink and the other of the legs to restrain motion of the heat sink relative to the electronic device.

12. A method of securing a heat sink to an electronic device, comprising:

positioning the heat sink in thermal contact with the electronic device;

compressing the heat sink against the electronic device with a clip to reduce thermal resistance between the heat sink and electronic device, the clip including two legs and a central section disposed between the legs; and attaching a spacer to the central portion of the clip, the spacer abutting the heat sink and one of the legs in order to restrain motion of the heat sink relative to the electronic device.

13. The method of claim 12, wherein compressing the heat sink against the electronic device includes engaging two legs on the clip with tabs that are on a socket which is connected to the electronic device.

14. The method of claim 12, wherein attaching a spacer to the clip includes abutting the spacer between one of two legs on the clip and a base on the heat sink.

15. The method of claim 14, further comprising attaching at least one additional spacer between the other of the legs and the heat sink.

16. The method of claim 12, further comprising forming the legs on the clip; and wherein attaching the spacer to the clip includes attaching the spacer to the clip after forming legs on the clip.

17. A computer system comprising:

a chassis;

a substrate mounted on the chassis;

an electronic device coupled to the substrate;

a heat sink;

a clip that compresses the heat sink against the electronic device, the clip including two legs and a central section disposed between the legs; and a spacer mounted on the central portion of the clip, the spacer abutting the heat sink and one of the legs to restrain motion of the heat sink relative to the electronic device.

18. The computer system of claim 17, wherein the substrate is a printed circuit board.

19. The computer system of claim 17, wherein each of the two legs on the clip is perpendicular to the central section disposed between the legs.

20. The computer system of claim 19, wherein the spacer abuts a base of the heat sink.

21. A kit of parts to form a heat sink assembly that is used to cool an electronic device, the kit comprising:

a heat sink adapted to be thermally coupled to the electronic device such that the heat sink conducts thermal energy away from the electronic device;

a clip adapted to compress the heat sink against the electronic device, the clip including two legs and a central section disposed between the legs; and a spacer adapted to be mounted on the central portion of the clip, the spacer abutting the heat sink and one of the legs to prevent the heat sink from moving relative to the electronic device.

22. The kit of claim 21, wherein each of the two legs on the clip is perpendicular to the central section disposed between the legs.

23. The kit of claim 22, further comprising at least one additional spacer that is adapted to abut the other leg on the clip and the heat sink.

24. A heat sink assembly to extract thermal energy from an electronic device, the heat sink assembly comprising:

a heat sink;

a clip compressing the heat sink against the electronic device; and a helical coil wrapped around the clip to restrain motion of the heat sink relative to the electronic device.

25. The heat sink assembly of claim 24, wherein the helical coil engages a base of the heat sink.

26. The heat sink assembly of claim 24, wherein the clip includes two legs and a central section disposed between the legs.

* * * * *